United States Patent
Saimoto et al.

(10) Patent No.: US 7,238,421 B2
(45) Date of Patent: Jul. 3, 2007

(54) PRESSURE SENSITIVE ADHESIVE FILM FOR PROTECTION OF SEMICONDUCTOR WAFER SURFACE AND METHOD OF PROTECTING SEMICONDUCTOR WAFER WITH THE PRESSURE SENSITIVE ADHESIVE FILM

(75) Inventors: Yoshihisa Saimoto, Nagoya (JP); Makoto Kataoka, Sodegaura (JP); Masafumi Miyakawa, Nagoya (JP); Shinichi Hayakawa, Nagoya (JP); Kouji Igarashi, Nagoya (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/506,806

(22) PCT Filed: Mar. 26, 2003

(86) PCT No.: PCT/JP03/03705

§ 371 (c)(1),
(2), (4) Date: Sep. 7, 2004

(87) PCT Pub. No.: WO03/083002

PCT Pub. Date: Oct. 9, 2003

(65) Prior Publication Data

US 2005/0161774 A1    Jul. 28, 2005

(30) Foreign Application Priority Data

Mar. 28, 2002  (JP) ............................. 2002-090493

(51) Int. Cl.
*B32B 15/04* (2006.01)
*H01L 21/30* (2006.01)
*H01L 21/46* (2006.01)
*H01L 23/58* (2006.01)

(52) U.S. Cl. ...................... 428/354; 438/459; 257/642

(58) Field of Classification Search ................ 257/642, 257/668, 783, 713, 643, 635; 438/459, 460; 428/354
See application file for complete search history.

(56) References Cited

U.S. PATENT DOCUMENTS

| | | | |
|---|---|---|---|
| 5,753,362 A * | 5/1998 | Kawase et al. | 428/327 |
| 6,114,753 A * | 9/2000 | Nagai et al. | 257/668 |
| 6,398,892 B1 * | 6/2002 | Noguchi et al. | 156/85 |
| 6,699,774 B2 * | 3/2004 | Takyu et al. | 438/460 |
| 6,730,595 B2 * | 5/2004 | Saimoto et al. | 438/654 |
| 6,777,310 B2 * | 8/2004 | Inuzuka | 438/460 |
| 2001/0014492 A1 * | 8/2001 | Noguchi et al. | 438/118 |

FOREIGN PATENT DOCUMENTS

| | | |
|---|---|---|
| EP | 0 959 498 A1 | 11/1999 |
| EP | 0 981 156 A2 | 2/2000 |
| EP | 1 002 845 A2 | 5/2000 |
| JP | 10-242086 A | 9/1998 |
| JP | 2001-077304 A | 3/2001 |
| JP | 2002-53819 A | 2/2002 |

OTHER PUBLICATIONS

English translation of JP 2002-053819 published Feb. 19, 2002.
English translation of JP 10-242086 published Sep. 11, 1998.

* cited by examiner

*Primary Examiner*—Shouxiang Hu
(74) *Attorney, Agent, or Firm*—Buchanan Ingersoll & Rooney PC

(57) ABSTRACT

The present invention relates to a surface protecting adhesive film for a semiconductor wafer in which an adhesive layer having a storage elastic modulus from $1 \times 10^5$ Pa to $1 \times 10^7$ Pa at 150° C. and a thickness of from 3 µm to 100 µm is formed on both a surface and back surface of a base film having a melting point of at least 200° C. and a thickness of 10 µm to 200 µm. According to the present invention, in a step of grinding the back side of a semiconductor wafer and removing a damaged layer generated on the back side, the semiconductor wafer can be prevented from being broken and being contaminated and the like even if a semiconductor wafer is thinned as low as 100 µm.

4 Claims, No Drawings

PRESSURE SENSITIVE ADHESIVE FILM FOR PROTECTION OF SEMICONDUCTOR WAFER SURFACE AND METHOD OF PROTECTING SEMICONDUCTOR WAFER WITH THE PRESSURE SENSITIVE ADHESIVE FILM

TECHNICAL FIELD

The present invention relates to surface protecting adhesive films for semiconductor wafers and protecting methods for semiconductor wafers using the adhesive films. More particularly, the present invention relates to a surface protecting adhesive film for a semiconductor wafer and a protecting method for a semiconductor wafer using the adhesive film which can prevent the breakage or the contamination of a semiconductor wafer and enhance the productivity in processing a non-circuit-formed surface of the semiconductor wafer.

BACKGROUND ART

A step of processing a semiconductor wafer comprises a step of adhering a surface protecting adhesive film for a semiconductor wafer to a circuit-formed surface of the semiconductor wafer, a step of processing a non-circuit-formed surface of the semiconductor wafer, a step of peeling a surface protecting adhesive film for the semiconductor wafer, a step of dicing for dividing and cutting the semiconductor wafer, then a step of molding for sealing the semiconductor chip with a resin for protecting the outer portion, and the like.

Conventionally, in a step of processing a non-circuit-formed surface of a semiconductor wafer, when thickness of the semiconductor wafer is removed to be as low as 200 μm, strength of the semiconductor wafer itself might be deteriorated due to a damaged layer caused by a mechanical grinding and the semiconductor wafer might be broken due to a minute stress. On this occasion, if a thickness of the semiconductor wafer is less than 200 μm, a non-circuit-formed surface of the semiconductor wafer is mechanically grinded and then a step of chemical treatment is additionally carried out in order to remove a damaged layer generated on the non-circuit-formed surface of the semiconductor wafer.

As an etching step of a chemical treatment, a wet etching step has been carried out, which uses mainly a mixture of fluorine and acetic acid. A circuit-formed surface is faced downward while a non-circuit-formed surface is faced upward to fix surrounding portions of a semiconductor wafer with clamps in a state that the semiconductor wafer is exposed with a nitrogen gas. The thus-clamped wafer is rotated at a high rate and an etching solution dropwise from the top at the same time. In this way, a wet etching step for processing a non-circuit-formed surface of the semiconductor wafer has been carried out. However, from the viewpoint of an environment, the treatment of a waste solution and the like has been worried.

In late years, a step of removing a damaged layer generated on a non-circuit-formed surface of a semiconductor wafer has been examined as an etching method in consideration of an environmental aspect by a plasma etching using plasma. However, inside the system is made at high temperatures and in vacua in order to generate plasma, thus resulting in breaking a semiconductor wafer or causing a fusion of an adhesive film in some cases. Further, there is a problem in that it is not possible to transport a semiconductor wafer from a chuck table.

Further, as an alternative step, a step of sputtering or evaporating a metal on a non-circuit-formed surface of a semiconductor wafer that was thinned after grinding a non-circuit-formed surface of a semiconductor wafer has been examined. Since the temperature and vacuum conditions are added in the same manner as the above plasma etching step, tapes might be greatly damaged.

In late years, the thinning of a semiconductor chip has been in high demand, and a chip having a thickness of from 20 μm to 100 μm has been required. In the mean time, a manufacturing process of a semiconductor wafer has been complicated. A protecting method for a semiconductor wafer capable of preventing the thus-thinned semiconductor wafer from the breaking and the processing various back side in a state that a semiconductor wafer is adhered to a substrate supporting the semiconductor wafer via a surface protecting adhesive film for a semiconductor wafer has been demanded as a step of processing a non-circuit-formed surface of a semiconductor wafer.

An example of a protecting method is disclosed in JP2001-77304A. In this patent is disclosed a method of joining a holding substrate having a thickness of more than 0.2 mm to a circuit-formed surface of a semiconductor wafer via a thermoplastic resin layer, and processing a non-circuit-formed surface of a semiconductor wafer. However, a method of this type might cause some problems such as a contamination of a semiconductor wafer and the breakage of a semiconductor wafer during the grind as stress of grinding pressure could not be absorbed in case of a further thinned wafer.

DISCLOSURE OF THE INVENTION

Under these circumstances, an object of the present invention is to provide a surface protecting adhesive film for a semiconductor wafer that is useful in preventing a semiconductor wafer from breaking due to a reduced strength of a semiconductor wafer resulting from thinning of a semiconductor wafer in multiple processing steps for a non-circuit-formed surface of a semiconductor wafer comprising a step of thinning a thickness of a semiconductor wafer to as low as 100 μm by a mechanical grinding and then a step of removing a damaged layer generated on a non-circuit-formed surface of a semiconductor wafer, as well as a protecting method for the semiconductor wafer using the above-described surface protecting adhesive film for the semiconductor wafer.

The present inventors have conducted an extensive study and, as a result, have found that an adhesive film is useful in protecting a semiconductor wafer, in which an adhesive layer having a specified storage elastic modulus on both a surface and a back surface of a base film having a superior heat resistance and a proper rigidity is formed, taking a reduced strength of a semiconductor wafer resulting from thinning of a semiconductor wafer and prevention of any contamination on a wafer by the adhesive layer when performing a step of adhering a circuit-formed surface of a semiconductor wafer to a substrate supporting the semiconductor wafer via a surface protecting adhesive film for the semiconductor wafer, a step of mechanically grinding a non-circuit-formed surface of the semiconductor wafer and then a step of removing a damaged layer generated on a non-circuit-formed surface of a semiconductor wafer.

That is, the present invention relates to a surface protecting adhesive film for a semiconductor wafer in which an adhesive layer having a storage elastic modules of from $1 \times 10^5$ Pa to $1 \times 10^7$ Pa at 150° C. and a thickness of from 3

μm to 100 μm is formed on both a surface and a back surface of a base film having a melting point of at least 200° C. and having a thickness of from 10 μm to 200 μm.

Further, according to the another aspect of the present invention, there is provided a protecting method for a semiconductor wafer wherein the surface protecting adhesive film for the semiconductor wafer according to the foregoing invention is used as a surface protecting adhesive film for the semiconductor wafer when performing steps of processing a non-circuit-formed surface of the semiconductor wafer comprising a first step of fixing a circuit-formed surface of the semiconductor wafer to a substrate supporting the semiconductor wafer via a surface protecting adhesive film for the semiconductor wafer having an adhesive layer on both a surface and a back surface of a base film, a second step of mechanically grinding a non-circuit-formed surface of the semiconductor wafer by fixing the semiconductor wafer on a grinding machine via the substrate, and then a third step of removing a damaged layer generated on the non-circuit-formed surface of the semiconductor wafer and/or applying a metal to a non-circuit-formed surface of a semiconductor wafer.

The characteristics of a surface protecting adhesive film for the semiconductor wafer according to the present invention are in that a melting point of a resin forming a base film is at least 200° C. and a storage elastic modulus of an adhesive layer at 150° C. is from $1 \times 10^5$ Pa to $1 \times 10^7$ Pa. By using the surface protecting adhesive film for the semiconductor wafer having the above-described performance, it is possible to prepare the desired results such that the breakage of a semiconductor wafer can be prevented even if a thickness of a semiconductor wafer is thinned to as low as 100 μm in a series of steps comprising a step of fixing a circuit-formed surface of a semiconductor wafer on a substrate supporting a semiconductor wafer via a surface protecting adhesive film for a semiconductor wafer and a step of multi-processing a circuit-formed surface of the semiconductor wafer.

The contamination resistance on the circuit-formed surface of the semiconductor wafer and cushion properties upon grind can be given by making a three-layer structure with adhesive layers having a specified elastic modulus and a base film.

BEST MODE FOR CARRYING OUT THE INVENTION

The present invention will be described in more detail below.

Firstly, a surface protecting adhesive film for a semiconductor wafer (hereinafter referred to also as the adhesive film) according to the present invention will be described. The adhesive film according to the present invention is prepared by forming an adhesive layer on both a surface and a back surface of a base film. Ordinarily, in order to prevent contamination on the adhesive layer, a release film is attached on a surface of the adhesive layer. As a method to form an adhesive layer on both a surface and a back surface of the base film, in consideration of an adhesion of a circuit-formed surface of the semiconductor wafer (hereinafter referred to also as the wafer surface) via a surface of the adhesive layer, in order to prevent contamination due to the adhesive layer on the surface of the semiconductor wafer, it is preferable that an adhesive agent coating solution is coated on one surface of the release film and dried to form an adhesive layer and, then, the thus-obtained adhesive layer is transferred to the base film.

It is preferable that a base film used for an adhesive film of the present invention has a melting point of at least 200° C. and a thickness of from 10 μm to 200 μm. In a step of grinding a non-circuit-formed surface of the semiconductor wafer (hereinafter referred to also as the wafer back side) and then removing a damaged layer generated on the wafer back side such as a wet etching step, a plasma etching step, a polishing step and the like, it is important to prevent thermal deformation of a base film in these steps, in consideration of a step of accompanying heating such as heat resulting from a reaction of the etching solution and the semiconductor wafer, high temperature and vacuum conditions in a system generated due to plasma, grind heat due to the polishing agent and the like. Under these viewpoints, the base film is preferably a resin having a melting point of at least 200° C. from a heat generated during the process and an estimated temperature in a system, and having a certain level of rigidity according to thinning of a semiconductor wafer. Ordinarily, a melting point of a resin forming a base film is from 200° C. to 300° C. in consideration of characteristics of the present resin. Further, from the viewpoint of rigidity, a hardening polyimide film having no melting point can be applied for a special film.

A thickness of a base film has an effect on an adhesive force. When the thickness is too lowered, an adhesive force becomes higher, but a bad peeling, adhesive residue and the like can easily occur. On the contrary, when the thickness is heightened, an adhesive force becomes deteriorated, thus resulting in reducing an adhesion on the wafer surface and deteriorating cutting properties of an adhesive film. In view of these features, the thickness of the base film is preferably from 10 μm to 200 μm.

As desirable resins to form a base film, there can be exemplified, for example, resin films formed from polyesters such as polyethylene terephthalate, polyethylene naphthalate and the like; polyphenylene sulfides, polyimides and the like and mixed resins thereof. Typical commercial products thereof include product name: Teonex manufactured by Teijin Ltd., product name: Torlon 4203L manufactured by Mitsubishi Chemical Corporation, product names: 45G and 200P manufactured by ICI, and product name: Torelina manufactured by Toray Industries Inc. and so forth.

It is preferable that the adhesive agent forming the adhesive layer of the adhesive film according to the present invention fully functions as an adhesive agent even under temperature conditions in a step of removing a damaged layer generated on the back surface of the semiconductor wafer. As for desirable adhesive agents, there can be exemplified, for example, an acrylic adhesive agent and a silicon adhesive agent. The thickness of the adhesive layer is preferably from 3 μm to 100 μm. When the adhesive film is peeled away from the wafer surface, it is preferable that no contamination occurs on the surface of the semiconductor wafer.

Particularly, it is preferable that the adhesive layer is cross-linked with a cross-linking agent having a reactive functional group, a peroxide, radioactive rays or the like at a high density lest the cohesive force is increased too much after exposing to high temperatures in processing the back side by a wet etching, a plasma etching and polishing, and the contaminations on the surface of the semiconductor wafer is increased. It is preferable that a bad peeling and any adhesive residue do not occur due to the increase in a cohesive force. To this effect, it is preferable that the adhesive layer has storage elastic modulus of from $1 \times 10^5$ Pa to $1\times10^7$ Pa at 150° C. It is more preferable that the adhesive layer has storage elastic modulus of from $1\times10^5$ Pa to $1\times10^7$ Pa at 200° C.

As a method of forming the adhesive layer having the foregoing characteristics, a method using an acrylic adhesive agent is exemplified. The adhesive layer is formed by using an acrylic adhesive agent which is an emulsion polymerization copolymer containing a (meth)acrylic acid alkyl ester monomer unit (A), a monomer unit (B) having a functional group capable of reacting with a cross-linking agent and a difunctional monomer unit (C) in specific amounts respectively, and a solution or an emulsion containing a cross-linking agent having two or more functional groups in a molecule for increasing a cohesive force or adjusting an adhesive strength. In case of using the acrylic adhesive agent in the preparation of a solution, the acrylic adhesive agent is separated from an emulsion prepared by emulsion polymerization through desalting or the like, re-dissolved in a solvent or the like, and used. The acrylic adhesive agent has quite a high molecular weight, and is, in many cases, less dissolved or not dissolved in a solvent. Therefore, in view of the cost as well, it is preferable to use the acrylic adhesive agent in the form of an emulsion as such.

As for the acrylic adhesive agent, there can be exemplified, for example, an acrylic adhesive agent prepared by using an acrylic acid alkyl ester, a methacrylic acid alkyl ester or a mixture thereof as a main monomer (hereinafter referred to also as a monomer (A)) and copolymerizing the same with a monomer mixture containing a comonomer having a functional group capable of reacting with a cross-linking agent.

As for the monomer (A), there can be exemplified, for example, an acrylic acid alkyl ester or a methacrylic acid alkyl ester containing an alkyl group having from 1 to 12 carbon atoms (these are generally referred to as a (meth)acrylic acid alkyl ester). Preferable is a (meth)acrylic acid alkyl ester containing an alkyl group having from 1 to 8 carbon atoms. Specifically, there can be exemplified, for example, methyl acrylate, methyl methacrylate, ethyl acrylate, ethyl methacrylate, butyl acrylate, butyl methacrylate, 2-ethylhexyl acrylate or the like. These may be used either singly or in a mixture of two or more. Usually, the amount used of the monomer (A) is preferably in the range of from 10 weight % to 98.9 weight % based on the total amount of all the monomers as raw materials of the adhesive agent. More preferably, it is in the range of from 85 weight % to 95 weight %. By specifying the amount used as the monomer (A) in such a range, a polymer containing from 10 weight % to 98.9 weight %, preferably from 85 weight % to 95 weight % of the (meth)acrylic acid alkyl ester monomer unit (A) can be prepared.

As for the monomer (B) forming the monomer unit (B) having the functional group capable of reacting with a cross-linking agent, there can be exemplified, for example, acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tertiary-butylaminoethyl acrylate, tertiary-butylaminoethyl methacrylate and the like.

Preferable are acrylic acid, methacrylic acid, 2-hydroxylethyl acrylate, 2-hydroxylethyl methacrylate, acrylamide, methacrylamide or the like. One of these may be copolymerized with the main monomer, or two or more thereof may be copolymerized therewith. Generally, it is preferable that the amount used as the monomer (B) having the functional group capable of reacting with a cross-linking agent is in the range of from 1 weight % to 40 weight % based on the total amount of all the monomers as raw materials of the adhesive agent. More preferable amount is in the range of from 1 weight % to 10 weight %. Thus, the polymer having the structural unit (B) with approximately the same composition as the monomer composition can be prepared.

Moreover, in order that the adhesive layer fully functions as an adhesive agent even under temperature conditions at the time of an etching process of the wafer back side in processing the back side of the semiconductor wafer, as a method for adjusting the adhesion or the peeling property, it is preferable to consider a cross-linking method of a particulate bulk for maintaining a cohesive force of the emulsion particles.

In order that the emulsion particles have storage elastic modulus of from $1\times10^5$ Pa to $1\times10^7$ Pa at 150° C., it is preferable to apply a cross-linking method to maintain a cohesive force by copolymerizing the difunctional monomer (C). As for the monomer to be copolymerized well, there can be exemplified, for example, allyl methacrylate, allyl acrylate, divinylbenzene, vinyl methacrylate, vinyl acrylate or the like. Included are other materials in which, for example, both ends are a diacrylate or a dimethacrylate and a structure of a main chain is propylene glycol (product names: PDP-200, PDP-400, ADP-200 and ADP-400, manufactured by Nippon Oils and Fats Co., Ltd.), tetramethylene glycol (product names: ADT-250 and ADT-850, manufactured by Nippon Oils and Fats Co., Ltd.) and a mixture thereof (product names: ADET-1800 and ADPT-4000, manufactured by Nippon Oils and Fats Co., Ltd.) and the like.

When the difunctional monomer (C) is emulsion-copolymerized, the amount used thereof is preferably in the range of from 0.1 weight % to 30 weight %, more preferably from 0.1 weight % to 5 weight % based on all the monomers. Thus, a polymer having the structural unit (C) with approximately the same composition as the monomer composition can be prepared.

In addition to the main monomer constituting the adhesive agent and the comonomer having the functional group capable of reacting with a cross-linking agent, a specific comonomer having a property as a surfactant (hereinafter referred to also as a polymerizable surfactant) may be copolymerized. The polymerizable surfactant has a property of being copolymerized with a main monomer and a comonomer, and also serves as an emulsifying agent in emulsion polymerization. In case of using an acrylic adhesive agent prepared by emulsion polymerization using a polymerizable surfactant, contamination on the wafer surface due to a surfactant does not usually occur. Further, even when slight contamination occurs due to an adhesive layer, it can easily be removed by washing the wafer surface with water.

As for such a polymerizable surfactant, there can be exemplified, for example, polyoxyethylene nonylphenyl ether with a polymerizable 1-propenyl group introduced in a benzene ring (product names: Aquaron RN-10, Aquaron RN-20, Aquaron RN-30, Aquaron RN-50 and the like, manufactured by Daiichi Kogyo Seiyaku Co., Ltd.), ammonium salt of sulfuric acid ester of polyoxyethylene nonylphenyl ether with a polymerizable 1-propenyl group introduced in a benzene ring (product names: Aquaron HS-10, Aquaron HS-20 and the like, manufactured by Daiichi Kogyo Seiyaku Co., Ltd.), and sulfosuccinic acid diester series having a polymerizable double bond in a molecule (product names: Latemul S-120A, Latemul S-180A and the like, manufactured by Kao Corporation).

Further, a monomer having a polymerizable double bond, such as vinyl acetate, acrylonitrile, styrene or the like may be copolymerized as required.

As for the polymerization reaction mechanism of the acrylic adhesive agent, there can be exemplified, for example, radical polymerization, anionic polymerization, cationic polymerization and the like. Considering the production cost of the adhesive agent, the influence of the functional groups of the monomers, the influence of ions on the surface of the semiconductor wafer and the like, the polymerization by radical polymerization is preferable. As for the radical polymerization initiator in the polymerization by the radical polymerization reaction, there can be exemplified, for example, organic peroxides such as benzoyl peroxide, acetyl peroxide, isobutyl peroxide, octanoyl peroxide, di-tertiary-butyl peroxide, di-tertiary-amyl peroxide and the like, inorganic peroxides such as ammonium persulfate, potassium persulfate, sodium persulfate and the like, and azo compounds such as 2,2'-azobisisobutyronitrile, 2,2'-azobis-2-methylbutyronitrile, 4,4'-azobis-4-cyanovaleric acid and the like.

In the polymerization by the emulsion polymerization method, among these radical polymerization initiators, water-soluble inorganic peroxides such as ammonium persulfate, potassium persulfate, sodium persulfate and the like, and also water soluble azo compounds having a carboxyl group in a molecule, such as 4,4'-azobis-4-cyanovaleric acid and the like are preferable. In consideration of the influence of ions on the surface of the semiconductor wafer, ammonium persulfate and azo compounds having a carboxyl group in a molecule, such as 4,4'-azobis-4-cyanovaleric acid and the like are more preferable. Azo compounds having a carboxyl group in a molecule, such as 4,4'-azobis-4-cyanovaleric acid and the like are particularly preferable.

The cross-linking agent having two or more cross-linkable functional groups in a molecule is used to be reacted with the functional group of the acrylic adhesive agent for adjusting an adhesive force and a cohesive force. As for the cross-linking agents, there can be exemplified, for example, epoxy compounds such as sorbitol polyglycidyl ether, polyglycerol polyglycidyl ether, pentaerythritol polyglycidyl ether, diglycerol polyglycidyl ether, glycerol polyglycidyl ether, neopentylglycol diglycidyl ether, resorcin diglycidyl ether and the like, isocyanate compounds such as tetramethylene diisocyanate, hexamethylene diisocyanate, trimethylolpropane toluene diisocyanate 3-addition product, polyisocyanate and the like, aziridine compounds such as trimethylolpropane-tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis(1-azilidinecarboxyamide), N,N'-toluene-2,4-bis(1-azilidinecarboxyamide), trimethylolpropane-tri-β-(2-methylaziridine)propionate and the like, tetrafunctional epoxy compounds such as N,N,N',N'-tetraglycidyl-m-xylenediamine, 1,3-bis(N,N'-diglycidylaminomethyl)cyclohexane, and melamine compounds such as hexamethoxymethylolmelamine and the like. These may be used either singly or in a mixture of two or more.

Ordinarily, the content of the cross-linking agent is preferably in such a range that the number of functional groups in the cross-linking agent is not larger than the number of functional groups in the acrylic adhesive agent. However, when a functional group is newly generated in the cross-linking reaction or when the cross-linking reaction proceeds slowly, the cross-linking agent may be contained in a larger amount as required. The range of elastic modulus is adjusted in the range of from $1 \times 10^5$ Pa to $1 \times 10^7$ Pa at 150° C. The preferable content of the cross-linking agent is in the range of from 0.1 weight part to 15 weight parts per 100 weight parts of the acrylic adhesive agent.

When the content is low, sometimes, the cohesive force of the adhesive layer may be insufficient, the elastic modulus may be less than $1 \times 10^5$ Pa at from 150° C. to 200° C. and heat resistance may be lacking. Accordingly, an adhesive residue due to the adhesive layer tends to occur in some cases. If the adhesive strength is increased, when the adhesive film is peeled away from the wafer surface, the peeling trouble may occur and the wafer may be completely broken in some cases. When the content is too much, the adhesive strength between the adhesive layer and the wafer surface is decreased, with the result that water or a grinding dust may be entered between the wafer surface and the adhesive layer in the step of grinding the wafer back side, and the breakage of the semiconductor wafer or contamination of the surface of the semiconductor wafer may occur in some cases. Moreover, when the absorbent properties of grind pressure is deteriorated, a thickness of the wafer is grinded less than 100 μm, and strength of the semiconductor wafer is lowered, the semiconductor wafer may be broken while in grinding in some cases.

The adhesive agent coating solution used in the present invention may properly contain tackifiers for adjusting a tackiness, such as rosin resins, terpene resins and the like, various surfactants and the like to such an extent that the aim of the present invention is not influenced, in addition to the acrylic adhesive agent prepared by copolymerizing the specific difunctional monomer and the cross-linking agent. Moreover, when the coating solution is an emulsion, film-forming agents such as diethylene glycol monoalkyl ethers and the like may properly be added to such an extent that the aim of the present invention is not influenced. Diethylene glycol monoalkyl ethers and their derivatives used as film-forming agents, when they are present in large amounts in the adhesive layer, might contaminate the wafer surface to such an extent that washing is impossible. For this reason, it is preferable that materials which are volatilized at a drying temperature of the adhesive agent coating solution are used to minimize the residual amounts of these in the adhesive layer.

The adhesive strength of the adhesive film in the present invention can properly be adjusted in consideration of the processing conditions of the semiconductor wafer, the diameter of the wafer, the thickness of the wafer after grinding the back side, the heating temperature at the time of an etching process of the wafer back side and the like. However, when the adhesive strength is too low, it tends to be, sometimes, difficult to laminate the adhesive film to the wafer surface, or the adhesive film is detached from the supporting substrate of the semiconductor wafer and a protecting property of the adhesive film becomes insufficient, whereby the semiconductor wafer may be broken or the wafer surface may be contaminated with grinding dusts or the like. Further, when the adhesive is too high, a peeling workability might be decreased such that some trouble may occur in peeling the adhesive film from the wafer surface after processing the wafer, or the semiconductor wafer might be broken. Usually, the adhesive strength is in the range of from 5 g/25 mm to 500 g/25 mm, preferably from 10 g/25 mm to 300 g/25 mm in terms of an adhesive strength in regard to an SUS304-BA plate.

As a method of coating the adhesive agent coating solution on one surface of the substrate film or the peeling film, known coating methods such as a roll coater method, a reverse roll coater method, a gravure roll method, a bar coating method, a comma coater method, a die coater method or the like can be applied. The conditions for drying the coated adhesive agent are not particularly limited. Generally, it is preferable to dry the same in a range of from 80° C. to 200° C. for from 10 seconds to 10 minutes. It is more preferable to dry the same at from 80° C. to 170° C. for from 15 seconds to 5 minutes. For satisfactorily promoting the cross-linking reaction of the cross-linking agent and the adhesive agent, the surface protecting adhesive film may be heated at from 40° C. to 80° C. for from 5 to 300 hours after the drying of the adhesive agent coating solution is completed. In order that the adhesive layer is formed on both the surface and back surface of the base film, it is preferable that an adhesive layer may first be formed on one surface according to the above method and the adhesive layer may then be formed on the other surface. Further, the adhesive layer may be formed on the surfaces of two sheets of the peeling films respectively and then the adhesive layer may be transferred to both the surface and back surface of the base film respectively. The adhesive layer on both the surface and back surface of the base film may be made of an adhesive agent of the same kind. Further a difference in the adhesive strength between the strong adhesion and weak adhesion may be accepted depending on substrates supporting semiconductor wafers. In this case, either of the adhesive layers may be laminated on the surface of the semiconductor wafer. However, it is preferable to laminate the adhesive layer having the weak adhesive strength.

The method of preparing the adhesive film for the semiconductor wafer in the present invention is as described above. However, in view of preventing the contamination on the surface of the semiconductor wafer, it is preferable that environments of producing all the raw materials such as the substrate film, the peeling film, the adhesive agent and the like and environments of preparing, storing, coating and drying the adhesive agent coating solution are maintained so as to comply with cleanliness of class 1000 or less regulated in U.S. Federal Standard 209b.

In a method of producing the semiconductor wafer to which the protecting method for the semiconductor wafer according to the present invention is applied, as described above, a first step of fixing the surface of the semiconductor wafer to the substrate supporting the semiconductor wafer via the adhesive film for a semiconductor wafer having an adhesive layer on both the surface and back surface of the base film, a second step of mechanically grinding the back side of the semiconductor wafer by fixing the semiconductor wafer on a grinding machine via the substrate, and then a third step of removing a damaged layer generated on the back side of the semiconductor wafer and/or applying a metal are carried out.

The subsequent steps are not particularly limited. For example, a method of producing a semiconductor wafer is exemplified in which a step of peeling a semiconductor wafer from the supporting substrate of the semiconductor wafer and the adhesive film, a step of dicing for dividing and cutting the semiconductor wafer, a step of molding for sealing the semiconductor chip with a resin for protecting the outer portion, and the like are carried out in sequence.

A protecting method for the semiconductor wafer according to the present invention will be described in detail below. In the protecting method for the semiconductor wafer in the present invention, the first step of fixing the surface of the semiconductor wafer to the substrate supporting the semiconductor wafer via the adhesive film for a semiconductor wafer having an adhesive layer on both the surface and back surface of the base film (hereinafter referred to also as the both-sided adhesive film) and the second step of mechanically grinding the back side of the semiconductor wafer by fixing the semiconductor wafer to a grinding machine via the substrate are carried out in sequence, and the third step of removing a damaged layer generated on the back side of the semiconductor wafer and/or applying a metal is then carried out. At this time, the both-sided adhesive film is used as a surface protecting adhesive film for a semiconductor wafer.

With respect to the details of the protecting method for the semiconductor wafer according to the present invention, first, the peeling film is peeled away from the side of the adhesive layer of the both-sided adhesive film to expose the surface of the adhesive layer, and the both-sided adhesive film is laminated to the surface of the semiconductor wafer via the adhesive layer. Then, the peeling film is peeled away from the other side of the adhesive layer of the both-sided adhesive film to adhere it to the substrate supporting the semiconductor wafer (first step). The same type adhesive of both-sided adhesive film may be used for the adhesive layer of the both-sided adhesive film. Further a difference in the adhesive strength between the strong adhesion and weak adhesion may be accepted depending on substrates supporting semiconductor wafers (adherent). The adhesive film may first be laminated to the substrate supporting the semiconductor wafer and then the semiconductor wafer may be laminated in sequence. At this time, it is important to prevent an entrainment of the air and the like in an attaching process.

As for the substrate supporting the semiconductor wafer used at this time, for example, glass plates or non-circuit-formed bear wafer and the like are exemplified. Subsequently, the semiconductor wafer is fixed on a chuck table of a grinding machine or the like via the substrate supporting the semiconductor wafer to mechanically grind the back side of the semiconductor wafer (second step). Further, a damaged layer generated on the back side of the semiconductor wafer is removed and/or a metal is applied (third step). Then, the semiconductor wafer is peeled away from the substrate supporting the semiconductor wafer on which an adhesive film is laminated. Further, after peeling the adhesive film, treatment such as water washing, plasma washing or the like is applied to the surface of the semiconductor wafer as required.

In the wafer back side processing step, a semiconductor wafer having a thickness of from 500 $\mu$m to 1,000 $\mu$m generally before grinding the back side, has been thinned to from 200 $\mu$m to 600 $\mu$m depending on the type of a semiconductor chip or the like. On the other hand, by applying the protecting method of the present invention, it can be thinned to a thickness of 100 $\mu$m or less. In this case, it is preferable that a step of removing a damaged layer generated on the back side of the semiconductor wafer is carried out subsequently to the back side grinding. The thickness of its etching is approximately from 0.5 $\mu$m to 60 $\mu$m. The thickness of the semiconductor wafer before grinding the back side is properly determined depending on the diameter, the type or the like of the semiconductor wafer, and the thickness of the semiconductor wafer after grinding the back side is properly determined depending on the size of a obtained chip, the type of the circuit or the like. In this case, the minimum thickness enabling thinning of the semiconductor wafer by applying the protecting method of the present invention is approximately 20 $\mu$m.

As a back side grinding method, known grinding methods such as a through-feed method, an in-feed method and the like are employed. In any of these methods, the back side grinding is usually conducted while cooling a semiconductor wafer and a grindstone by feeding water thereto. After the completion of the back side grinding, processes such as the wet etching, the plasma etching, the polishing and the like are conducted for removing a damaged layer generated on the back side of the semiconductor wafer. The wet etching step, the plasma etching step and the polishing step are conducted for thinning the semiconductor wafer, removing an oxide layer, conducting pretreatment in forming an electrode on the back side, and the like in addition to removal of a damaged layer generated on the back side of the semiconductor wafer. The etching solution, plasma conditions and polishing agent are properly selected according to the foregoing purposes. In a step of applying a metal, a layer made of gold, nickel, titanium or the like is formed on the back side of a semiconductor. Further, a step of applying gold bumps and solder bumps can be carried out depending on the devices.

The wafer surface after the adhesive film is peeled away is washed as required. As for the washing method, there can be exemplified, for example, wet washing such as water washing, solvent washing or the like, dry washing such as plasma washing or the like, and so forth. In the wet washing, ultrasonic washing may be used in combination. These washing methods are properly selected depending on the contamination condition on the wafer surface.

As for the semiconductor wafer to which the protecting method for the semiconductor wafer in the present invention can be applied, there can be exemplified, for example, a silicon wafer as well as wafers of germanium, gallium-arsenic, gallium-phosphorus, gallium-arsenic-aluminum and the like.

EXAMPLES

The present invention is now more specifically illustrated below with reference to Examples. In all of Examples and Comparative Examples demonstrated to be described below, preparation and coating of an adhesive coating solution, back grinding of a semiconductor silicon wafer, removal test of a damaged layer after the back grinding and the like were carried out in environments maintained so as to comply with cleanliness of class 1000 or less regulated in U.S. Federal Standard 209b. The present invention is not limited to these Examples. Various properties described in Examples were measured by the following methods.

1. Measurement of an Adhesive Force (g/25 mm)

An adhesive strength is measured according to a method regulated in JIS Z0237-1991 except for conditions defined below. Each of adhesive films prepared in Examples and Comparative Examples is laminated to a surface of an SUS304-BA plate of 5 cm×20 cm (regulated in JIS G-4305-1991) via its adhesive layer at 23° C., and allowed to stand for 60 minutes. One end of the sample is held and the sample is peeled away from the surface of the SUS304-BA plate at a peel angle of 180° and a peel rate of 300 mm/min. At this time, a stress is measured, and converted in terms of a width of 25 mm.

2. Storage Elastic Modulus (Pa)

A portion of an adhesive layer of an adhesive film is laminated to a thickness of 1 mm to prepare a sample for measuring a viscoelasticity having a diameter of 8 mm. A storage elastic modulus is measured at 150° C. and 200° C. using a dynamic viscoelasticity measuring device (Model: RMS-800, manufactured by Rheometrics Inc.). A measurement frequency is 1 Hz, and a warpage is in a range of from 0.1% to 3%.

3. Evaluation of a Contamination

A sample adhesive film is laminated to a whole surface of a semiconductor silicon wafer (diameter: approx. 200 mm (8 inch), thickness: 600 µm, depth of a scribe line: 8 µm, width of a scribe line: 100 µm) via its adhesive layer, and subjected to a back grinding step of the semiconductor wafer and a step of removing a damaged layer of the back side (a chemical etching, polishing or a plasma etching). The adhesive film is then peeled away. Thereafter, the surface of the semiconductor wafer is observed with a laser focus microscope (Models: VF-7510, VF-7500 and VP-ED100, manufactured by KEYENCE Co., Ltd.) at 250 magnifications. The number of samples is 10 in each step of removing a damaged layer of the back side. The evaluation standard is as follows. ○: When no adhesive residue occurs, no abrasive or chemical etching solution is entered at the time of polishing between the wafer surface and the adhesive film and no peeling trouble occurs, [○] is marked. When an adhesive residue occurs, bad peeling or the like is observed, the number of appropriate samples is indicated.

4. Breakage of a Semiconductor Wafer (Number of Sheets)

The number of broken semiconductor wafers in a step of grinding a back side of a semiconductor wafer, a step of removing a damaged layer generated on the back side and a step of peeling an adhesive film is described. The number of samples is 10 in each step of removing a damaged layer of the back side. ○: When no breakage of a semiconductor wafer occurs, [○] is indicated. When a breakage or a crack in a semiconductor wafer occurs, the number of appropriate sheets is indicated.

Preparation Examples of an Adhesive 1-1. Preparation Example 1 of an Adhesive
(Adhesive 1)

A polymerization reaction vessel was charged with 150 weight parts of deionized water, 0.625 weight part of 4,4'-azobis-4-cyanovaleric acid (product name: ACVA, manufactured by Otsuka Chemical Co., Ltd.) as a polymerization initiator, 62.25 weight parts of 2-ethylhexyl acrylate, 18 weight parts of n-butyl acrylate and 12 weight parts of methyl methacrylate as a monomer (A), 3 weight parts of 2-hydroxyethyl methacrylate, 2 weight parts of methacrylic acid and 1 weight part of acrylamide as a monomer (B), 1 weight part of polytetramethylene glycol diacrylate (product name: ADT-250, manufactured by Nippon Oils And Fats Co., Ltd.) as a monomer (C), and 0.75 weight part of ammonium salt of sulfuric acid ester of polyoxyethylene nonylphenyl ether (average number of moles added of ethylene oxide: approximately 20) with a polymerizable 1-propenyl group introduced in a benzene ring (product name: Aquaron HS-10, manufactured by Daiichi Kogyo Seiyaku Co., Ltd.) as a water-soluble comonomer. The reactants were stirred at from 70° C. to 72° C. for 8 hours to prepare an acrylic resin emulsion. This was neutralized with 9 weight % of aqueous ammonia (pH=7.0) to prepare an acrylic adhesive agent (adhesive agent 1) having a solid content of 42.5 weight %.

1-2. Comparative Preparation Example 1 of an Adhesive (Adhesive 2)

A polymerization reaction vessel was charged with 150 weight parts of deionized water, 0.625 weight part of 4,4'-azobis-4-cyanovaleric acid (product name: ACVA, manufactured by Otsuka Chemical Co., Ltd.) as a polymerization initiator, 63.25 weight parts of 2-ethylhexyl acrylate, 18 weight parts of n-butyl acrylate and 12 weight parts of methyl methacrylate as a monomer (A), 3 weight parts of 2-hydroxyethyl methacrylate, 2 weight parts of methacrylic acid and 1 weight part of acrylamide as a monomer (B), and 0.75 weight part of ammonium salt of sulfuric acid ester of polyoxyethylene nonylphenyl ether (average number of moles added of ethylene oxide: approximately 20) with a polymerizable 1-propenyl group introduced in a benzene ring (product name: Aquaron HS-10, manufactured by Daiichi Kogyo Seiyaku Co., Ltd.) as a water-soluble comonomer. The reactants were stirred at from 70° C. to 72° C. for 8 hours to prepare an acrylic resin emulsion. This was neutralized with 9 weight % of aqueous ammonia (pH=7.0) to prepare an acrylic adhesive agent (adhesive agent 2) having a solid content of 42.5 weight %.

1-3. Comparative Preparation Example 2 of an Adhesive (Adhesive 3)

A polymerization reaction vessel was charged with 150 weight parts of deionized water, 0.625 weight part of 4,4'-azobis-4-cyanovaleric acid (product name: ACVA, manufactured by Otsuka Chemical Co., Ltd.) as a polymerization initiator, 93.25 weight parts of 2-ethylhexyl acrylate as a monomer (A), 3 weight parts of 2-hydroxyethyl methacrylate, 2 weight parts of methacrylic acid and 1 weight part of acrylamide as a monomer (B), and 0.75 weight part of ammonium salt of sulfuric acid ester of polyoxyethylene nonylphenyl ether (average number of moles added of ethylene oxide: approximately 20) with a polymerizable 1-propenyl group introduced in a benzene ring (product name: Aquaron HS-10, manufactured by Daiichi Kogyo Seiyaku Co., Ltd.) as a water-soluble comonomer. The reactants were stirred at 70° C. to 72° C. for 8 hours to prepare an acrylic resin emulsion. This was neutralized with 9 weight % of aqueous ammonia (pH=7.0) to prepare an acrylic adhesive agent (adhesive agent 3) having a solid content of 42.5 weight %.

Preparation Examples of an Adhesive Coating Solution

2-1. Preparation Example 1 of an Adhesive Coating Solution (Adhesive Coating Solution 1)

100 weight parts of the adhesive 1 prepared in Preparation Example 1 of an Adhesive was collected, and further adjusted to pH of 9.5 with the addition of 9 weight % of aqueous ammonia. Subsequently, 0.8 weight part of an aziridine cross-linking agent (product name: Chemitight Pz-33, manufactured by Nippon Shokubai Kagaku Kogyo Co., Ltd.) was added to prepare an adhesive agent coating solution 1.

2-2. Comparative Preparation Example 1 of an Adhesive Coating Solution (Adhesive Coating Solution 2)

An adhesive coating solution 2 was prepared in the same manner as in Preparation Example 1 of an Adhesive Coating Solution except using the adhesive 2 prepared in Comparative Preparation Example 1 of an Adhesive.

2-3. Comparative Preparation Example 2 of an Adhesive Coating Solution (Adhesive Coating Solution 3)

An adhesive coating solution 3 was prepared in the same manner as in Preparation Example 1 of an Adhesive Coating Solution except using the adhesive 3 prepared in Comparative Preparation Example 2 of an Adhesive

Preparation Examples of an Adhesive Film

3-1. Preparation Example 1 of an Adhesive Film (Adhesive Film 1)

The adhesive coating solution 1 was coated on a polypropylene film (peeling film, thickness: 50 μm) using a roll coater, and dried at 120° C. for 2 minutes to prepare an adhesive layer having a thickness of 10 μm. A polyethylene terephthalate film which is subjected to a corona discharge treatment on its both sides (melting point: 255° C., film thickness: 12 μm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 1. The storage elastic modulus of the adhesive layer was $1.5 \times 10^5$ Pa at 150° C. and $1.3 \times 10^5$ Pa at 200° C. Further, the adhesive strength was 230 g/25 mm when measuring an adhesive film where an adhesive layer was formed on one surface.

3-2. Preparation Example 2 of an Adhesive Film (Adhesive Film 2)

The adhesive coating solution 1 was coated on a polypropylene film (peeling film, thickness: 50 μm) using a roll coater, and dried at 120° C. for 2 minutes to form an adhesive layer having a thickness of 10 μm. A polyethylene terephthalate film which is subjected to a corona discharge treatment on its both sides (melting point: 255° C., film thickness: 50 μm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 2. The storage elastic modulus of the adhesive layer was $1.5 \times 10^5$ Pa at 150° C. and $1.3 \times 10^5$ Pa at 200° C. Further, the adhesive strength was 120 g/25 mm when measuring an adhesive film where an adhesive layer was formed on one surface.

3-3. Preparation Example 3 of an Adhesive Film (Adhesive Film 3)

The adhesive coating solution 1 was coated on a polypropylene film (peeling film, thickness: 50 μm) using a roll coater, and dried at 120° C. for 2 minutes to form an adhesive layer having a thickness of 10 μm. A polyethylene terephthalate film which is subjected to a corona discharge treatment on its both sides (melting point: 255° C., film thickness: 100 μm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 3. The storage elastic modulus of the adhesive layer was $1.5 \times 10^5$ Pa at 150° C. and $1.3 \times 10^5$ Pa at 200° C. Further, the adhesive strength was 55 g/25 mm when measuring an adhesive film where an adhesive layer was formed on one surface.

3-4. Preparation Example 4 of an Adhesive Film (Adhesive Film 4)

The adhesive coating solution 1 was coated on a polypropylene film (peeling film, thickness: 50 µm) using a roll coater, and dried at 120° C. for 2 minutes to form an adhesive layer having a thickness of 10 µm. A polyethylene terephthalate film which is subjected to a corona discharge treatment on its both sides (melting point: 255° C., film thickness: 190 µm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 4. The storage elastic modulus of the adhesive layer was $1.5 \times 10^5$ Pa at 150° C. and $1.3 \times 10^5$ Pa at 200° C. Further, the adhesive strength was 30 g/25 mm when measuring an adhesive film where an adhesive layer was formed on one surface.

3-5. Preparation Example 5 of an Adhesive Film (Adhesive Film 5)

The adhesive coating solution 1 was coated on a polypropylene film (peeling film, thickness: 50 µm) using a roll coater, and dried at 120° C. for 2 minutes to form an adhesive layer having a thickness of 10 µm. A polyethylene naphthalate film which is subjected to a corona discharge treatment on its both sides (melting point: 269° C., film thickness: 100 µm) as a base film was coated to the thus-formed adhesive layer, and pressed to transfer the adhesive layer. The adhesive layer is formed on the other side of polyethylene naphthalate film in the same manner to prepare the both-sided adhesive film. After the transfer, the film was heated at 60° C. for 48 hours, and then cooled down to room temperature to prepare a adhesive film 5. The storage elastic modulus of the adhesive layer was $1.5 \times 10^5$ Pa at 150° C. and $1.3 \times 10^5$ Pa at 200° C. Further, the adhesive strength was 60 g/25 mm when measuring an adhesive film where an adhesive layer was formed on one surface.

3-6. Preparation Example 6 of an Adhesive Film (Adhesive Film 6)

The adhesive coating solution 1 was coated on a polypropylene film (peeling film, thickness: 50 µm) using a roll coater, and dried at 120° C. for 2 minutes to form an adhesive layer having a thickness of 10 µm. A polyphenylene sulfide film which is subjected to a corona discharge treatment on its both sides (melting point: 285° C., film thickness: 75 µm) as a base film was coated to the thus-formed adhesive layer, and pressed to transfer the adhesive layer. The adhesive layer is formed on the other side of polyphenylene sulfide film in the same manner to prepare the both-sided adhesive film. After the transfer, the film was heated at 60° C. for 48 hours, and then cooled down to room temperature to prepare a adhesive film 6. The storage elastic modulus of the adhesive layer was $1.5 \times 10^5$ Pa at 150° C. and $1.3 \times 10^5$ Pa at 200° C. Further, the adhesive strength was 90 g/25 mm when measuring an adhesive film where an adhesive layer was formed on one surface.

3-7. Preparation Example 7 of an Adhesive Film (Adhesive Film 7)

The adhesive coating solution 1 was coated on a polypropylene film (peeling film, thickness: 50 µm) using a roll coater, and dried at 120° C. for 2 minutes to form an adhesive layer having a thickness of 10 µm. A polyimide film which is subjected to a corona discharge treatment on its both sides (melting point: 300° C., film thickness: 75 µm) as a base film was coated to the thus-formed adhesive layer, and pressed to transfer the adhesive layer. The adhesive layer is formed on the other side of polyimide film in the same manner to prepare the both-sided adhesive film. After the transfer, the film was heated at 60° C. for 48 hours, and then cooled down to room temperature to prepare a adhesive film 7. The storage elastic modulus of the adhesive layer was $1.5 \times 10^5$ Pa at 150° C. and $1.3 \times 10^5$ Pa at 200° C. Further, the adhesive strength was 70 g/25 mm when measuring an adhesive film where an adhesive layer was formed on one surface.

3-8. Preparation Example 8 of an Adhesive Film (Adhesive Film 8)

The adhesive coating solution 1 was coated on a polypropylene film (peeling film, thickness: 50 µm) using a roll coater, and dried at 120° C. for 2 minutes to form an adhesive layer having a thickness of 10 µm. A polyethylene terephthalate film which is subjected to a corona discharge treatment on its both sides (melting point: 255° C., film thickness: 100 µm) as a base film was coated to the thus-formed adhesive layer, and pressed to transfer the adhesive layer. The adhesive layer having a thickness of 40 µm is formed on the other side of polyethylene terephthalate film in the same manner to prepare the both-sided adhesive film having a different adhesive strength. After the transfer, the film was heated at 60° C. for 48 hours, and then cooled down to room temperature to prepare a adhesive film 8. The storage elastic modulus of the adhesive layer was $1.5 \times 10^5$ Pa at 150° C. and $1.3 \times 10^5$ Pa at 200° C. Further, the adhesive strength of the adhesive layer having a thickness of 10 µm was 55 g/25 mm and the adhesive strength of the adhesive layer having a thickness of 40 µm was 90 g/25 mm when measuring an adhesive film where an adhesive layer was formed on one surface.

3-9. Preparation Example 9 of an Adhesive Film (Adhesive Film 9)

The adhesive coating solution 1 was coated on a polypropylene film (peeling film, thickness: 50 µm) using a roll coater, and dried at 120° C. for 2 minutes to form an adhesive layer having a thickness of 10 µm. A polyethylene terephthalate film which is subjected to a corona discharge treatment on its both sides (melting point: 255° C., film thickness: 100 µm) as a base film was coated to the thus-formed adhesive layer, and pressed to transfer the adhesive layer. The adhesive layer having a thickness of 40 µm is formed on the other side of polyethylene terephthalate film in the same manner to prepare the both-sided adhesive film having a different adhesive force. After the transfer, the film was heated at 60° C. for 48 hours, and then cooled down to room temperature to prepare a adhesive film 9. The storage elastic modulus of the adhesive layer was $1.5 \times 10^5$ Pa at 150° C. and $1.3 \times 10^5$ Pa at 200° C.

Further, the adhesive strength of the adhesive layer having a thickness of 10 µm was 55 g/25 mm and the adhesive strength of the adhesive layer having a thickness of 40 µm was 90 g/25 mm when measuring an adhesive film where an adhesive layer was formed on one surface.

3-10. Preparation Example 10 of an Adhesive Film (Adhesive Film 10)

The adhesive coating solution 1 was coated on a polypropylene film (peeling film, thickness: 50 µm) using a roll coater, and dried at 120° C. for 2 minutes to form an adhesive layer having a thickness of 5 µm. A polyethylene terephthalate film which is subjected to a corona discharge treatment on its both sides (melting point: 255° C., film thickness: 50 µm) as a base film was coated to the thus-formed adhesive layer, and pressed to transfer the adhesive layer. The adhesive layer having a thickness of 5 µm is formed on the other side of polyethylene terephthalate film in the same manner to prepare the both-sided adhesive film. After the transfer, the film was heated at 60° C. for 48 hours, and then cooled down to room temperature to prepare a adhesive film 10. The storage elastic modulus of the adhesive layer was $1.5 \times 10^5$ Pa at 150° C. and $1.3 \times 10^5$ Pa at 200° C. Further, the adhesive strength was 100 g/25 mm when measuring an adhesive film where an adhesive layer was formed on one surface.

3-11. Preparation Example 11 of an Adhesive Film (Adhesive Film 11)

The adhesive coating solution 1 was coated on a polypropylene film (peeling film, thickness: 50 µm) using a roll coater, and dried at 120° C. for 2 minutes to form an adhesive layer having a thickness of 80 µm. A polyethylene terephthalate film which is subjected to a corona discharge treatment on its both sides (melting point: 255° C., film thickness: 50 µm) as a base film was coated to the thus-formed adhesive layer, and pressed to transfer the adhesive layer. The adhesive layer having a thickness of 80 µm is formed on the other side of polyethylene terephthalate film in the same manner to prepare the both-sided adhesive film. After the transfer, the film was heated at 60° C. for 48 hours, and then cooled down to room temperature to prepare a adhesive film 11. The storage elastic modulus of the adhesive layer was $1.5 \times 10^5$ Pa at 150° C. and $1.3 \times 10^5$ Pa at 200° C. Further, the adhesive strength was 160 g/25 mm when measuring an adhesive film where an adhesive layer was formed on one surface.

3-12. Comparative Preparation Example 1 of an Adhesive Film (Adhesive Film 12)

The adhesive coating solution 2 was coated on a polypropylene film (peeling film, thickness: 50 µm) using a roll coater, and dried at 120° C. for 2 minutes to form an adhesive layer having a thickness of 10 µm. A polyethylene terephthalate film which is subjected to a corona discharge treatment on its both sides (melting point: 255° C., film thickness: 100 µm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 12. The storage elastic modulus of the adhesive layer was $5.0 \times 10^4$ Pa at 150° C. and $3.0 \times 10^4$ Pa at 200° C. Further, the adhesive strength was 70 g/25 mm when measuring an adhesive film where an adhesive layer was formed on one surface.

3-13. Comparative Preparation Example 2 of an Adhesive Film (Adhesive Film 13)

The adhesive coating solution 1 was coated on a polypropylene film (peeling film, thickness: 50 µm) using a roll coater, and dried at 120° C. for 2 minutes to form an adhesive layer having a thickness of 10 µm. A polyethylene terephthalate film which is subjected to a corona discharge treatment on its both sides (melting point: 255° C., film thickness: 6 µm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 13. The storage elastic modulus of the adhesive layer was $1.5 \times 10^5$ Pa at 150° C. and $1.3 \times 10^5$ Pa at 200° C. Further, the adhesive strength was 330 g/25 mm when measuring an adhesive film where an adhesive layer was formed on one surface.

3-14. Comparative Preparation Example 3 of an Adhesive Film (Adhesive Film 14)

The adhesive coating solution 1 was coated on a polypropylene film (peeling film, thickness: 50 µm) using a roll coater, and dried at 120° C. for 2 minutes to form an adhesive layer having a thickness of 10 µm. A polyethylene terephthalate film which is subjected to a corona discharge treatment on its both sides (melting point: 255° C., film thickness: 250 µm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 14. The storage elastic modulus of the adhesive layer was $1.5 \times 10^5$ Pa at 150° C. and $1.3 \times 10^5$ Pa at 200° C. Further, the adhesive strength was 8 g/25 mm when measuring an adhesive film where an adhesive layer was formed on one surface.

3-15. Comparative Preparation Example 4 of an Adhesive Film (Adhesive Film 15)

The adhesive coating solution 1 was coated on a polypropylene film (peeling film, thickness: 50 µm) using a roll coater, and dried at 120° C. for 2 minutes to form an adhesive layer having a thickness of 10 µm. A polypropylene film which is subjected to a corona discharge treatment on its both sides (melting point: 160° C., film thickness: 100 µm) as a base film was coated to the thus-formed adhesive layer, and pressed to transfer the adhesive layer. The adhesive layer is formed on the other side of polypropylene film in the same manner to prepare the both-sided adhesive film. After the transfer, the film was heated at 60° C. for 48 hours, and then cooled down to room temperature to prepare a adhesive film 15. The storage elastic modulus of the adhesive layer was $1.5 \times 10^5$ Pa at 150° C. and $1.3 \times 10^5$ Pa at 200°

C. Further, the adhesive strength was 80 g/25 mm when measuring an adhesive film where an adhesive layer was formed on one surface.

3-16. Comparative Preparation Example 5 of an Adhesive Film (Adhesive Film 16)

The adhesive coating solution 1 was coated on a polypropylene film (peeling film, thickness: 50 μm) using a roll coater, and dried at 120° C. for 2 minutes to form an adhesive layer having a thickness of 10 μm. An ethylene vinyl acetate copolymer film which is subjected to a corona discharge treatment on its both sides (melting point: 85° C., film thickness: 120 μm) as a base film was coated to the thus-formed adhesive layer, and pressed to transfer the adhesive layer. The adhesive layer is formed on the other side of ethylene vinyl acetate copolymer film in the same manner to prepare the both-sided adhesive film. After the transfer, the film was heated at 60° C. for 48 hours, and then cooled down to room temperature to prepare a adhesive film 16. The storage elastic modulus of the adhesive layer was $1.5 \times 10^5$ Pa at 150° C. and $1.3 \times 10^5$ Pa at 200° C. Further, the adhesive strength was 120 g/25 mm when measuring an adhesive film where an adhesive layer was formed on one surface.

3-17. Comparative Preparation Example 6 of an Adhesive Film (Adhesive Film 17)

The adhesive coating solution 3 was coated on a polypropylene film (peeling film, thickness: 50 μm) using a roll coater, and dried at 120° C. for 2 minutes to form an adhesive layer having a thickness of 10 μm. A polyethylene terephthalate film which is subjected to a corona discharge treatment on its both sides (melting point: 255° C., film thickness: 50 μm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the product was heated at 60° C. for 48 hours, and then cooled down to room temperature to prepare a adhesive film 17. The storage elastic modulus of the adhesive layer was $1.2 \times 10^4$ Pa at 150° C. and $0.8 \times 10^4$ Pa at 200° C. Further, the adhesive strength was 40 g/25 mm when measuring an adhesive film where an adhesive layer was formed on one surface.

3-18. Comparative Preparation Example 7 of an Adhesive Film (Adhesive Film 18)

The adhesive coating solution 3 was coated on a polypropylene film (peeling film, thickness: 50 μm) using a roll coater, and dried at 120° C. for 2 minutes to form an adhesive layer having a thickness of 120 μm. A polyethylene terephthalate film which is subjected to a corona discharge treatment on its both sides (melting point: 255° C., film thickness: 50 μm) as a base film was coated to the thus-formed adhesive layer, and pressed to transfer the adhesive layer. The adhesive layer is formed on the other side of polyethylene terephthalate film in the same manner to prepare the both-sided adhesive film. After the transfer, the film was heated at 60° C. for 48 hours, and then cooled down to room temperature to prepare a adhesive film 18. The storage elastic modulus of the adhesive layer was $1.5 \times 10^5$ Pa at 150° C. and $1.3 \times 10^5$ Pa at 200° C. Further, the adhesive strength was 220 g/25 mm when measuring an adhesive film where an adhesive layer was formed on one surface.

3-19. Comparative Preparation Example 8 of an Adhesive Film (Adhesive Film 19)

A thermoplastic polyimide film having a composition of 200° C. or more of a glass transition temperature was formed to prepare a film 19. The storage elastic modulus of the thus-formed film was $3.0 \times 10^9$ Pa at 150° C. and $2.0 \times 10^9$ Pa at 200° C.

<Protecting Performance of a Semiconductor Wafer by an Adhesive Film>
<Method of Back Processing and Devices Used>
(1) A Device (Model: BEST, manufactured by Disco Inc. and Nisso Engineering Co., Ltd.) was used for back grinding and chemical etching. (2) A Device (Model: PG200, manufactured by Tokyo Seimitsu Co., Ltd.) was used for back grinding and polishing. (3) Devices (Model: DFG850 and SR10, manufactured by Disco Inc.) were used for back grinding and plasma etching.

Example 1

A glass plate (thickness: 1.0 μm) in a shape almost identical to a semiconductor silicon wafer was adhered to a whole circuit-formed surface of a semiconductor silicon wafer (diameter: approx. 200 mm (8 inch), thickness: 600 μm, depth of a scribe line: 8 μm, width of a scribe line: 100 μm) where an integrated circuit can be formed via an adhesive film 1 to prepare an evaluation sample. 30 evaluation samples (a set) were prepared in the same manner as the above.

(1) Back grinding and chemical etching: Back grinding of a semiconductor silicon wafer was first carried out on 10 sheets of the thus-prepared sample to have a thickness of 70 μm for the wafer, using the above device. Then, a chemical etching was carried out on the wafer back surface to have a thickness of 50 μm for the wafer.

(2) Back grinding and polishing: Back grinding of a semiconductor silicon wafer was first carried out on 10 sheets of the thus-prepared sample to have a thickness of 52 μm for the wafer, using the above device. Then, polishing was carried out on the wafer back surface to have a thickness of 50 μm for the wafer.

(3) Back grinding and plasma etching: Back grinding of a semiconductor silicon wafer was first carried out on 10 sheets of the thus-prepared sample to have a thickness of 52 μm for the wafer, using the above device. Then, a plasma etching was carried out on the wafer back surface to have a thickness of 50 μm for the wafer.

According to the above back processing (1) to (3), there was no semiconductor silicon wafer on which any crack was generated due to breakage of the semiconductor silicon wafer and deformation of the adhesive film. Further no contamination such as an adhesive residue or the like was observed on the wafer surface after the adhesive film was peeled. The results are shown in Table 1.

Examples 2 to 11 and Comparative Examples 1 to 8

(1) Back grinding and chemical etching (2) back grinding and polishing and (3) back grinding and plasma etching were carried out in the same manner as in Example 1 except that the adhesive films 2 to 19 were used instead of the adhesive film 1 to evaluate protecting performance of the adhesive film. Further, in Example 8 (adhesive film 8 used) and Example 9 (adhesive film 9 used), the adhesive layer having a weak adhesive force was adhered to the surface of the semiconductor wafer. The results are shown in Tables 1 to 3.

TABLE 1

|  |  | Example 1 | Example 2 | Example 3 | Example 4 | Example 5 | Example 6 | Example 7 |
|---|---|---|---|---|---|---|---|---|
| Construction of Adhesive Film | Base Film | PET | PET | PET | PET | PEN | PPS | PI |
|  | Thickness (μm) | 12 | 50 | 100 | 190 | 100 | 75 | 75 |
|  | Melting Point (° C.) | 255 | 255 | 255 | 255 | 269 | 285 | — |
|  | Main Agent | 1 | 1 | 1 | 1 | 1 | 1 | 1 |
|  | Coating Solution | 1 | 1 | 1 | 1 | 1 | 1 | 1 |
|  | Adhesive Film | 1 | 2 | 3 | 4 | 5 | 6 | 7 |
| Thickness of Adhesive Layer (μm) |  | 10 | 10 | 10 | 10 | 10 | 10 | 10 |
| Adhesive Force [g/25 mm] |  | 230 | 120 | 55 | 30 | 60 | 90 | 70 |
| Elastic Modulus [Pa] |  | $1.5 \times 10^5$ | $1.5 \times 10^5$ | $1.5 \times 10^5$ | $1.5 \times 10^5$ | $1.5 \times 10^5$ | $1.5 \times 10^5$ | $1.5 \times 10^5$ |
| Wafer Breakage in Back Grinding (Number of Wafers) |  | 0 | 0 | 0 | 0 | 0 | 0 | 0 |
| Contamination after Back Grinding and Chemical Etching |  | 0 | 0 | 0 | 0 | 0 | 0 | 0 |
| Contamination after Back Grinding and Polishing |  | 0 | 0 | 0 | 0 | 0 | 0 | 0 |
| Contamination after Back Grinding and Plasma Etching |  | 0 | 0 | 0 | 0 | 0 | 0 | 0 |
| Wafer Breakage after Back Grinding and Chemical Etching |  | 0 | 0 | 0 | 0 | 0 | 0 | 0 |
| Wafer Breakage after Back Grinding and Polishing |  | 0 | 0 | 0 | 0 | 0 | 0 | 0 |
| Wafer Breakage after Back Grinding and Plasma Etching |  | 0 | 0 | 0 | 0 | 0 | 0 | 0 |

TABLE 2

|  |  | Example 8 | Example 9 | Example 10 | Example 11 |
|---|---|---|---|---|---|
| Construction of Adhesive Film | Base Film | PET | PET | PET | PET |
|  | Thickness (μm) | 100 | 100 | 50 | 50 |
|  | Melting Point (° C.) | 255 | 255 | 255 | 255 |
|  | Main Agent | 1 | 1 | 1 | 1 |
|  | Coating Solution | 1 | 1 | 1 | 1 |
|  | Adhesive Film | 8 | 9 | 10 | 11 |
| Thickness of Adhesive Layer (μm) |  | 10, 40 | 10, 40 | 5 | 80 |
| Adhesive Force [g/25 mm] |  | 55, 90 | 55, 90 | 100 | 160 |
| Elastic Modulus [Pa] |  | $1.5 \times 10^5$ | $1.5 \times 10^5$ | $1.5 \times 10^5$ | $1.5 \times 10^5$ |
| Wafer Breakage in Back Grinding (Number of Wafers) |  | 0 | 0 | 0 | 0 |
| Contamination after Back Grinding and Chemical Etching |  | 0 | 0 | 0 | 0 |
| Contamination after Back Grinding and Polishing |  | 0 | 0 | 0 | 0 |
| Contamination after Back Grinding and Plasma Etching |  | 0 | 0 | 0 | 0 |
| Wafer Breakage after Back Grinding and Chemical Etching |  | 0 | 0 | 0 | 0 |
| Wafer Breakage after Back Grinding and Polishing |  | 0 | 0 | 0 | 0 |
| Wafer Breakage after Back Grinding and Plasma Etching |  | 0 | 0 | 0 | 0 |

TABLE 3

|  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Construction of Adhesive Film | Base Film | PET | PET | PET | PP | EVA | PET | PET | Thermoplastic PI |
|  | Thickness (μm) | 100 | 6 | 250 | 100 | 120 | 50 | 50 | 50 |
|  | Melting Point (° C.) | 255 | 255 | 255 | 160 | 85 | 255 | 255 | 200 or more |
|  | Main Agent | 2 | 1 | 1 | 1 | 1 | 3 | 3 | — |
|  | Coating Solution | 2 | 1 | 1 | 1 | 1 | 3 | 3 | — |
|  | Adhesive Film | 12 | 13 | 14 | 15 | 16 | 17 | 18 | 19 |
| Thickness of Adhesive Layer (μm) |  | 10 | 10 | 10 | 10 | 10 | 10 | 120 | — |
| Adhesive Force [g/25 mm] |  | 70 | 330 | 8 | 80 | 120 | 40 | 220 | — |

TABLE 3-continued

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Elastic Modulus [Pa] | $0.5 \times 10^5$ | $1.5 \times 10^5$ | $1.5 \times 10^5$ | $1.5 \times 10^5$ | $1.5 \times 10^5$ | $1.5 \times 10^5$ | $1.5 \times 10^5$ | $3.0 \times 10^5$ |
| Back Grinding | 0 | 0 | 0 | 0 | 0 | 0 | 0 | 0 |
| Back Processing — Chemical Etching | 0 | 0 | 0 | 0 | 0 | 0 | 0 | 0 |
| Back Processing — Polishing | 0 | 0 | x | 0 | 0 | 0 | 0 | 0 |
| Back Processing — Plasma Etching | 0 | 0 | x | x | x | 0 | 0 | 0 |
| Contamination after Back Grinding and Chemical Etching | 0 | Bad peeling | penetration of etching solution | 0 | 0 | 6 wafers: adhesive residue | 1 wafer: adhesive residue | 10 wafers: adhesive residue |
| Contamination after Back Grinding and Polishing | 0 | Bad peeling | penetration of polishing agent | 0 | 0 | 8 wafers: adhesive residue | Bad peeling | 10 wafers: adhesive residue |
| Contamination after Back Grinding and Plasma Etching | 4 wafers: adhesive residue | Bad peeling | Plasma error | Film deformed | Film deformed | 8 wafers: adhesive residue | 5 wafers: adhesive residue | 10 wafers: adhesive residue |
| Wafer Breakage after Back Grinding and Chemical Etching | 0 | 0 | — | 0 | 0 | 0 | 0 | 5 wafers broken |
| Wafer Breakage after Back Grinding and Polishing | 0 | 0 | — | 0 | 0 | 0 | 0 | 8 wafers broken |
| Wafer Breakage after Back Grinding and Plasma Etching | 0 | 0 | — | 2 wafers cracked | 6 wafers cracked | 0 | 0 | 6 wafers broken |

INDUSTRIAL APPLICABILITY

According to the present invention, even if a thickness of the wafer is thinned as low as 100 μm, a semiconductor wafer can be prevented from being broken and being contaminated or the like in a step of grinding the back side of the semiconductor wafer and removing a damaged layer generated on the back side.

The invention claimed is:

1. A surface protecting adhesive film for a semiconductor wafer comprising a base film having a front surface and a back surface and having a melting point of at least 200° C. and a thickness of 10 to 200 μm and an acrylic adhesive layer having a storage elastic modulus from $1 \times 10^5$ Pa to $1 \times 10^7$ Pa at 150° C., an adhesive force from 5g/25 mm to 500g/25 mm in regard to an SUS304-BA plate and a thickness of from 3 to 100 μm whereby the acrylic adhesive layer can be peeled away from a semiconductor wafer surface, wherein the acrylic adhesive layer is formed on both of the front surface and the back surface of the base film wherein the SUS304-BA plate is defined in accordance with Japanese Industrial Standard.

2. The surface protecting adhesive film for a semiconductor wafer according to claim 1, wherein the base film comprises at least one resin film selected from a group consisting of a polyethylene terephthalate, a polyethylene naphthalate, a polyphenylene sulfide and a polyimide.

3. A protecting method for a semiconductor wafer in a step of processing a non-circuit-formed surface of a semiconductor wafer comprising a first step of fixing a circuit-formed surface of the semiconductor wafer to a substrate supporting the semiconductor wafer via a surface protection adhesive film for the semiconductor wafer having an adhesive layer on both a front surface and a back surface of a base film, a second step of fixing the semiconductor wafer on a semiconductor wafer grinding machine via the substrate and mechanically grinding the non-circuit-formed surface of the semiconductor wafer, and a third step of removing a damaged layer generated on the non-circuit-formed surface of the semiconductor wafer in sequence, wherein the surface protecting adhesive film according to claim 1 is used as the surface protecting adhesive film for the semiconductor wafer.

4. The protecting method for the semiconductor wafer according to claim 3, wherein the third step comprises at least one step selected from a wet etching step, a plasma etching step and a polishing step.

* * * * *